(12) United States Patent
Chung et al.

(10) Patent No.: US 10,822,694 B2
(45) Date of Patent: Nov. 3, 2020

(54) SUBSTRATE PROCESSING APPARATUS AND METHOD OF CLEANING THE SAME

(71) Applicant: Samsung Electronics Co., Ltd., Suwon-si, Gyeonggi-do (KR)

(72) Inventors: Sukjin Chung, Hwaseong-si (KR); Bongjin Kuh, Suwon-si (KR); Kook Tae Kim, Hwaseong-si (KR); In-Sun Yi, Seoul (KR); Soojin Hong, Guri-si (KR)

(73) Assignee: Samsung Electronics Co., Ltd. (KR)

( * ) Notice: Subject to any disclaimer, the term of this patent is extended or adjusted under 35 U.S.C. 154(b) by 210 days.

(21) Appl. No.: 16/104,311

(22) Filed: Aug. 17, 2018

(65) Prior Publication Data

US 2019/0055647 A1 Feb. 21, 2019

(30) Foreign Application Priority Data

Aug. 17, 2017 (KR) .................. 10-2017-0104261

(51) Int. Cl.
*C23C 16/44* (2006.01)
*C23C 16/458* (2006.01)
*C23C 16/455* (2006.01)

(52) U.S. Cl.
CPC ...... *C23C 16/4408* (2013.01); *C23C 16/4404* (2013.01); *C23C 16/4405* (2013.01); *C23C 16/4584* (2013.01); *C23C 16/45578* (2013.01)

(58) Field of Classification Search
CPC ............ C23C 16/4408; C23C 16/4405; C23C 16/45578; C23C 16/4404; C23C 16/4584; H01L 21/683; H01L 21/67017; H01L 21/67

USPC .................. 118/719; 156/345.31, 345.32
See application file for complete search history.

(56) References Cited

U.S. PATENT DOCUMENTS

| 6,878,234 | B2 * | 4/2005 | Ogasawara ......... H01J 37/3244 |
| | | | 118/715 |
| 6,903,025 | B2 | 6/2005 | Mizushima |
| 7,615,163 | B2 | 11/2009 | Tamura et al. |
| 7,662,235 | B2 | 2/2010 | Yoshida et al. |
| 7,695,567 | B2 | 4/2010 | Fu |
| 8,809,195 | B2 | 8/2014 | Elers |
| 9,051,655 | B2 | 6/2015 | Wu Kai et al. |
| 2007/0137794 | A1 * | 6/2007 | Qiu .......................... C23C 16/46 |
| | | | 156/345.33 |
| 2011/0294280 | A1 * | 12/2011 | Takasawa ............... C23C 16/30 |
| | | | 438/478 |

(Continued)

FOREIGN PATENT DOCUMENTS

| KR | 100249387 | 3/2000 |
| KR | 101465338 | 11/2014 |

*Primary Examiner* — Rudy Zervigon
(74) *Attorney, Agent, or Firm* — Myers Bigel, P.A.

(57) ABSTRACT

Disclosed are a substrate processing apparatus and a method of cleaning the apparatus. The apparatus includes a process chamber, a support unit in the process chamber and configured to support a substrate, and a gas injection unit in the process chamber. The gas injection unit includes a first injection portion configured to inject a source gas, a second injection portion facing the first injection portion and configured to inject a reaction gas that reacts with the source gas, and a third injection portion configured to inject a cleaning gas that removes a reactant produced from the source gas and the reaction gas.

20 Claims, 12 Drawing Sheets

(56) References Cited

U.S. PATENT DOCUMENTS

2014/0287595 A1* 9/2014 Shimamoto ....... H01L 21/02274
438/774
2015/0218695 A1 8/2015 Odedra
2016/0064190 A1* 3/2016 Noh ................. H01J 37/32779
156/345.33

* cited by examiner

SUBSTRATE PROCESSING APPARATUS AND METHOD OF CLEANING THE SAME

CROSS-REFERENCE TO RELATED APPLICATIONS

This U.S. nonprovisional patent application claims priority under 35 U.S.C § 119 from Korean Patent Application No. 10-2017-0104261, filed on Aug. 17, 2017, the entire contents of which are hereby incorporated by reference.

BACKGROUND

The present inventive concepts relate to a substrate processing apparatus and a method of cleaning the same.

In general, the fabrication of semiconductor devices requires a number of processes such as a deposition process, a photolithography process, and a cleaning process. Among these processes, the deposition process, such as CVD (Chemical Vapor Deposition) or ALD (Atomic Layer Deposition), is employed to form a material layer on a substrate.

When the deposition process is performed, the material layer is deposited not only on the substrate, but on a process chamber and the like. It is accordingly requested or required that the cleaning process be periodically performed to remove the material layer deposited on the process chamber and the like.

SUMMARY

Some embodiments of the present inventive concepts provide a substrate processing apparatus and a method of cleaning the same.

An object of the present inventive concepts is not limited to those mentioned above, and other objects which have not been mentioned above will be clearly understood to those skilled in the art from the following description.

According to example embodiments of the present inventive concepts, a substrate processing apparatus may include: a process chamber; a support unit in the process chamber and configured to support a substrate; and a gas injection unit in the process chamber. The gas injection unit may include: a first injection portion configured to inject a source gas; a second injection portion facing the first injection portion and configured to inject a reaction gas that reacts with the source gas; and a third injection portion configured to inject a cleaning gas that removes a reactant produced from the source gas and the reaction gas.

According to example embodiments of the present inventive concepts, a substrate processing apparatus may include a process chamber, a source gas supply containing a source gas, a reaction gas supply containing a reaction gas, a cleaning gas supply containing a cleaning gas, a support unit in the process chamber and configured to support a substrate, and a gas injection unit in the process chamber. The gas injection unit may include a source gas injection portion in fluid communication with the source gas supply and configured to inject the source gas, a reaction gas injection portion in fluid communication with the reaction gas supply and configured to inject the reaction gas that reacts with the source gas, and a cleaning gas injection portion in fluid communication with the cleaning gas supply and configured to inject the cleaning gas that removes a reactant produced from the source gas and the reaction gas. The source gas injection portion and the reaction gas injection portion may be on opposite sides of the process chamber.

According to example embodiments of the present inventive concepts, a substrate processing apparatus may include: a process chamber; a support unit in the process chamber and configured to support a substrate; and a gas injection unit including a cleaning gas injection portion configured to provide the process chamber with a cleaning gas that removes a reactant on the process chamber. The reactant may include aluminum oxide ($Al_2O_3$). The cleaning gas may include CHxCly (where, x=0 to 4 and y=4−x) or SiHxCly (where, x=0 to 4 and y=4−x).

According to example embodiments of the present inventive concepts, a method of cleaning a substrate processing apparatus may include: providing a process chamber with a cleaning gas to remove a reactant on the process chamber; and reacting the cleaning gas and the reactant with each other to remove the reactant on the process chamber. The reactant may include aluminum oxide ($Al_2O_3$). The cleaning gas may include CHxCly (where, x=0 to 4 and y=4−x) or SiHxCly (where, x=0 to 4 and y=4−x).

Details of other example embodiments are included in the description and drawings.

DETAILED DESCRIPTION

It will be herein discussed in detail the present inventive concepts and their embodiments with reference to the accompanying drawings. As used herein the expression "and/or" includes any and all combinations of one or more of the associated listed items.

Figure 1:
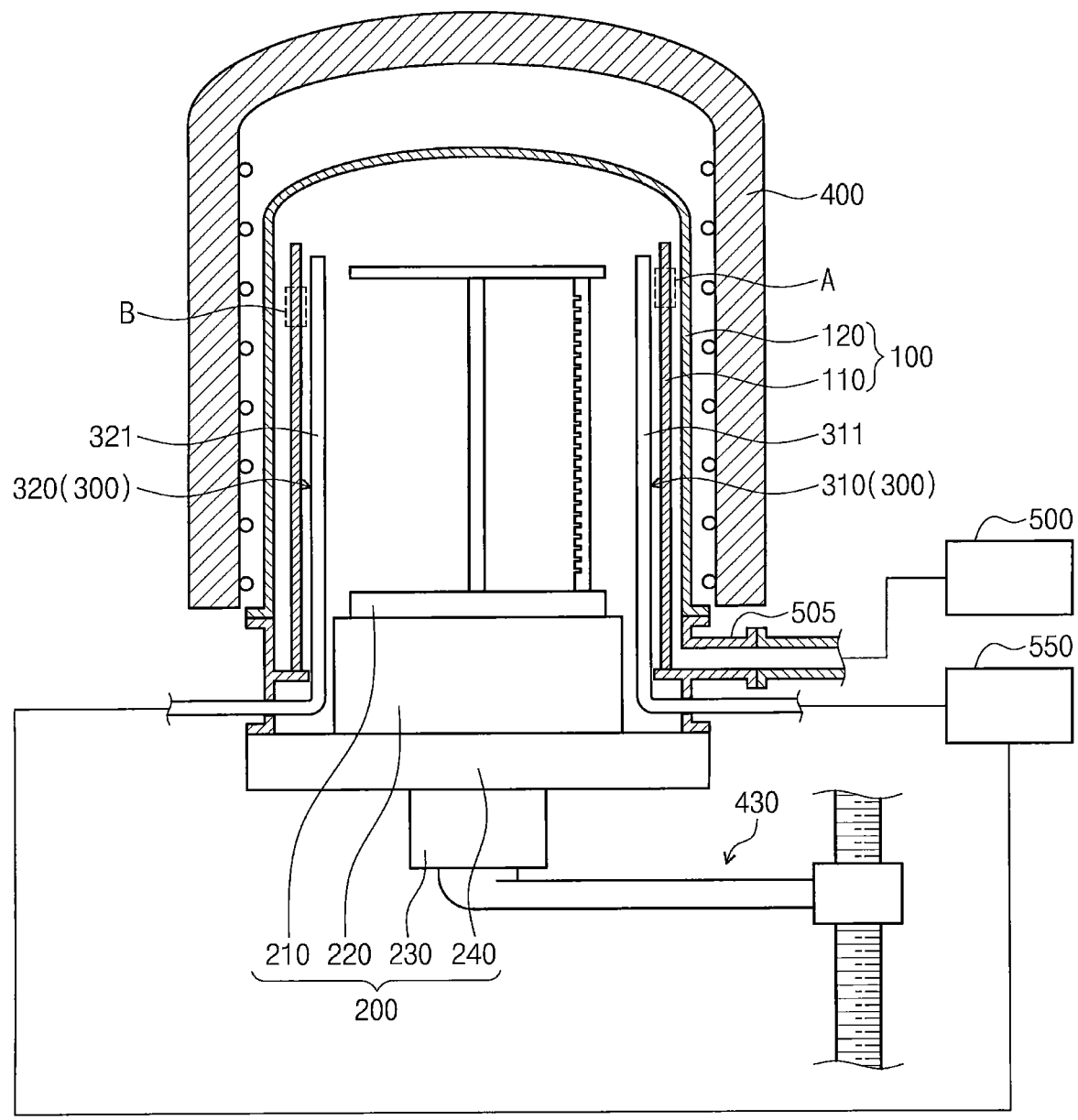
FIG. 1 illustrates a simplified schematic diagram showing a substrate processing apparatus according to example embodiments of the present inventive concepts.
Figure 2:
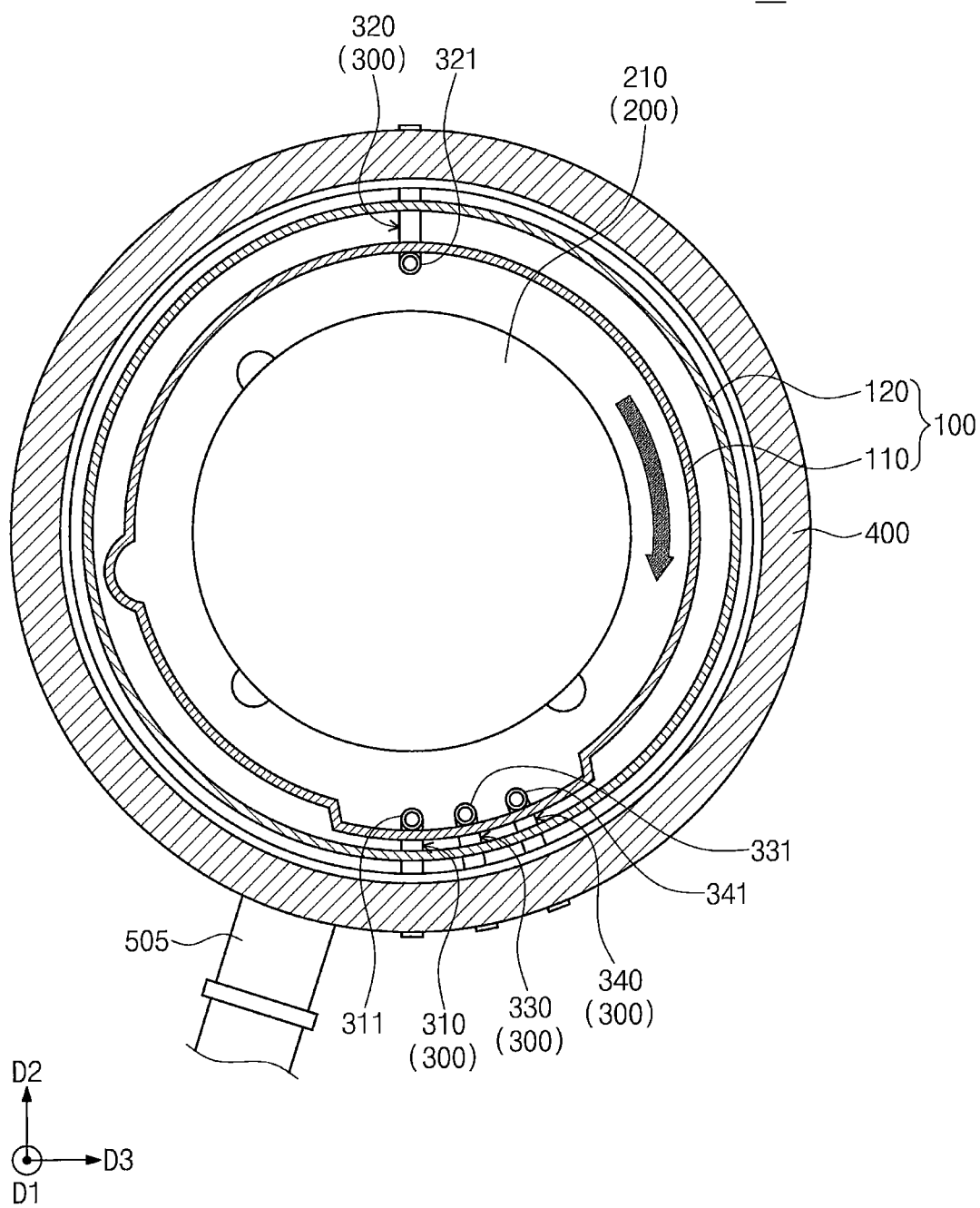
FIG. 2 illustrates a plan view showing the substrate processing apparatus of FIG. 1.
Figure 3:
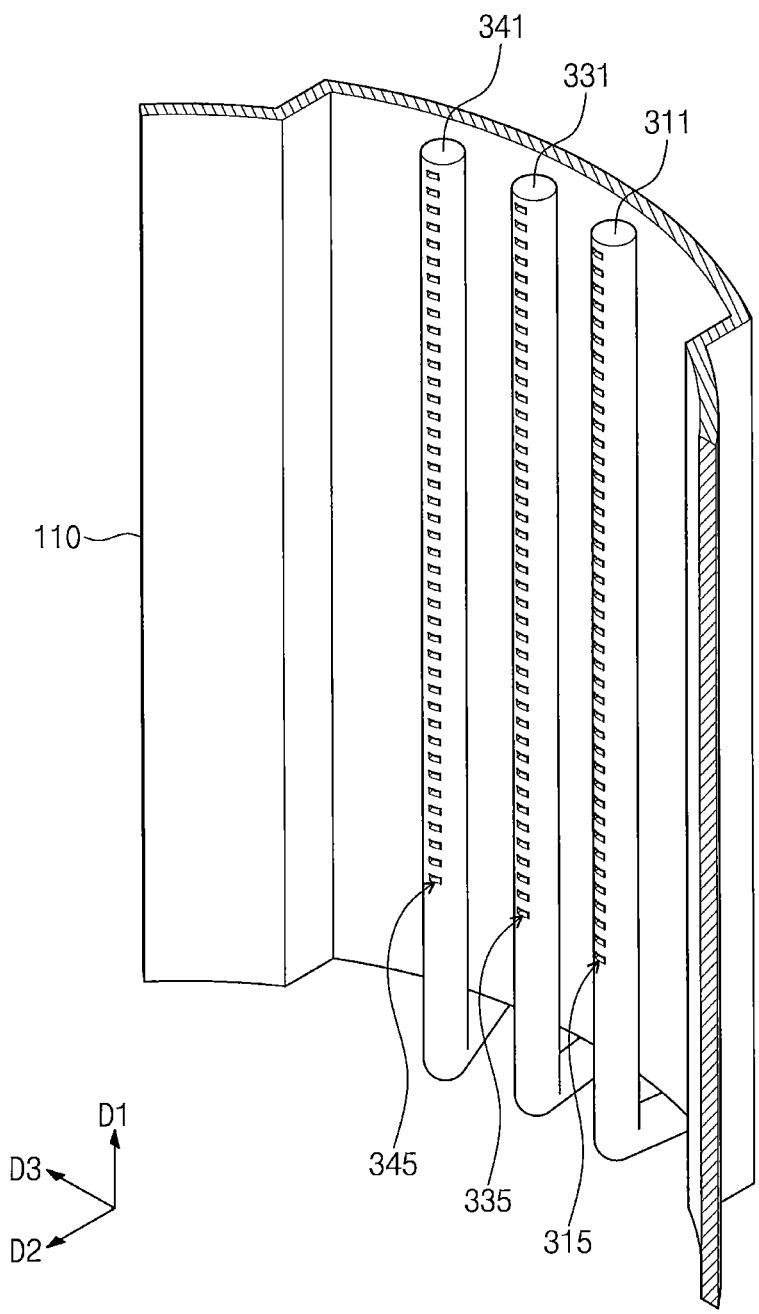
FIG. 3 illustrates a perspective view partially showing the substrate processing apparatus of FIG. 1.

FIG. 1 illustrates a simplified schematic diagram showing a substrate processing apparatus according to example embodiments of the present inventive concepts. FIG. 2 illustrates a plan view showing the substrate processing apparatus of FIG. 1. FIG. 3 illustrates a perspective view partially showing the substrate processing apparatus of FIG. 1.

Referring to FIGS. 1 to 3, a substrate processing apparatus 10 according to example embodiments of the present inventive concepts may provide a substrate with a process gas to process the substrate. For example, the substrate processing apparatus 10 may perform a deposition process in which a thin layer is deposited on the substrate. In particular, the substrate process apparatus 10 may be a time-division Atomic Layer Deposition (ALD) apparatus. The substrate processing apparatus 10 may include a process chamber 100, a support unit or support system 200, a gas injection unit or gas injection system 300, and a gas exhaust unit or gas exhaust system 500. The substrate processing apparatus 10 may further include a heating unit or heater 400, an elevation unit or elevator 430, and a gas supply unit or gas supply system 550.

The process chamber 100 may provide an inner space where a process is performed on the substrate. The process chamber 100 may be composed of or include a refractory material. As discussed below, a $Cl_2$ gas may be introduced into the process chamber 100, and process gases may be reacted to produce a Cl-based gas. The process chamber 100 may be composed of or include a material exhibiting an excellent corrosion resistance to the Cl-based gas. For example, the process chamber 100 may include yttrium oxide ($Y_2O_3$).

In some embodiments, the process chamber 100 may include an outer tube 120 and an inner tube 110. The inner tube 110 may be provided in the shape of a cylinder having an open top and bottom. The inner tube 110 may have a circular ring shape when viewed in plan (e.g., when viewed from above or below). The outer tube 120 may surround the inner tube 110. For example, the outer tube 120 may be provided in the shape of a cylinder or cylindrical duct having a closed top. The outer tube 120 may have an open bottom.

The gas exhaust unit 500 may discharge gases from the process chamber 100. The gas exhaust unit 500 may decompress the process chamber 100. The gas exhaust unit 500 may include a vacuum pump and an exhaust port 505 provided at or in the process chamber 100.

The support unit 200 may be positioned in the process chamber 100. The support unit 200 may support the substrate. In some embodiments, the support unit 200 may include a substrate load member 210, a support plate 220, and a rotating member or rotatable member 230. The support unit 200 may further include a seal cap member 240.

The substrate load member 210 may be placed on the support plate 220. The substrate load member 210 may load or receive a plurality of substrates along a first direction D1 (e.g., a vertical direction). In some embodiments, the substrate load member 210 may be a boat having slots into which, for example, 25 or 50 substrates are loaded. The elevation unit 430 may cause the substrate load member 210 to go into (enter) or come out of (exit) the process chamber 100. For example, the substrate load member 210 may be loaded into or unloaded from the inner tube 110.

The support plate 220 may support the substrate load member 210. The support plate 220 may be positioned on the seal cap member 240. The support plate 220 may be loaded into or unloaded from the process chamber 100.

The seal cap member 240 may be positioned beneath the process chamber 100. In some embodiments, the seal cap member 240 may close the open bottom of the outer tube 120. The elevation unit 430 may drive the seal cap member 240 to move along a direction parallel to the first direction D1. For example, the seal cap member 240 may move in an up-and-down direction. In this description, the direction parallel to the first direction D1 may be the up-and-down direction.

A sealing member may be provided on a contact portion between the seal cap member 240 and the outer tube 120. The sealing member may be an O-ring. The sealing member may prevent a gas leakage between the process chamber 100 and the seal cap member 240.

The rotating member 230 may rotate the substrate load member 210. For example, the rotating member 230 may rotate the seal cap member 240 and/or the support plate 220 to thereby rotate the support load member 210. The rotating member 230 may include a rotary motor. The rotating member 230 may be installed on the seal cap member 240.

The gas injection unit 300 may be disposed in the process chamber 100. The gas injection unit 300 may be connected to to the gas supply unit 550 via one or more supply lines. A plurality of process gases may be introduced into the gas injection unit 300 through the supply line(s) from the gas supply unit 550. The process chamber 100 may receive the process gases injected from the gas injection unit 300. The process gases may include a source gas, a reaction gas, a cleaning gas, a chemical gas, and a chlorine ($Cl_2$) gas. The gas supply unit 550 may contain the source gas, the reaction gas, the cleaning gas, the chemical gas, and the chlorine gas. For example, the gas supply unit 550 may include a source gas supply containing the source gas, a reaction gas supply containing the reaction gas, a cleaning gas supply containing the cleaning gas, a chemical gas supply containing the chemical gas, and/or a chlorine gas supply containing the chlorine gas. The gas injection unit 300 may inject the process gases, such as the source gas, the reaction gas, the cleaning gas, and the chemical gas, in various manners. In some embodiments, the gas injection unit 300 may include a first injection portion 310, a second injection portion 320, and a third injection portion 330. The gas injection unit 300 may further include a fourth injection portion 340.

The first injection portion 310 may inject the source gas into the process chamber 100. The first injection portion 310 may lie or be adjacent the exhaust port 505. The first injection portion 310 may include a source nozzle or source gas nozzle 311 that is elongated along the first direction D1. The source nozzle 311 may be provided vertically in the inner tube 110 of the process chamber 100. The source nozzle 311 may be positioned between the substrate load member 210 and the inner tube 110. The source nozzle 311 may include a plurality of first injection apertures or holes 315 arranged along the first direction D1. In some embodiments, the source gas may include an aluminum (Al) precursor.

The second injection portion 320 may inject the reaction gas that reacts with the source gas. In some embodiments, the reaction gas may include one or more of $H_2O$ and ozone ($O_3$). The reaction gas may react with the source gas to thereby produce a reactant (e.g., aluminum oxide ($Al_2O_3$)). The reactant may be produced by the following equations, and the produced reactant may be deposited on the substrate, the process chamber 100, the support unit 200, and the gas injection unit 300.

$$2Al + O_3 \rightarrow Al_2O_3 \qquad \text{Equation 1}$$

$$4Al + 6H_2O \rightarrow 2Al_2O_3 + 6H_2 \qquad \text{Equation 2}$$

As the deposition process is progressively performed on the substrate, a thickness of the reactant (e.g., BP of FIG. 5) deposited on the process chamber 100 and/or the support unit 200 may increase. The reactant, whose thickness exceeds a predetermined value, may be separated from the process chamber 100 and/or the support unit 200. The separated reactant may drop to the substrate and thus cause failure of the substrate. Accordingly, it may be required that the process chamber 100 and/or the support unit 200 be periodically cleaned to remove the reactant.

The third injection portion 330 may provide the process chamber 100 with the cleaning gas that removes the reactant produced from the reaction between the source gas and the reaction gas. When the process chamber 100 receives the cleaning gas, a cleaning process may be performed on the process chamber 100, the support unit 200, the gas injection unit 300, and the like. For example, the cleaning process may be performed in situ under a condition that the process chamber 100 and/or the support unit 200 are not disassembled.

The cleaning gas may etch the reactant deposited on the process chamber 100 and/or the support unit 200. The cleaning gas may include one or more of boron trichloride ($BCl_3$), $CH_xCl_y$ (where, x=0 to 4), and $SiH_xCl_y$ (where, x=0 to 4). For example, the cleaning gas may include $CHCl_3$, $CCl_4$, $SiCl_4$, or the like. The cleaning gas may be removed by the following equations.

$$Al_2O_3 + 2BCl_3 \rightarrow 2AlCl_3 + B_2O_3, \Delta H = 541 \text{ KJ/mol} \quad \text{Equation 3}$$

$$Al_2O_3 + 2CHCl_3 \rightarrow 2AlCl_3 + 2CO + H_2O, \Delta H = 37.14 \text{ KJ/mol} \quad \text{Equation 4}$$

$$2Al_2O_3 + 4SiHCl_3 \rightarrow 4AlCl_3 + 4SiO_2 + 2H_2O, \Delta H = 1884 \text{ KJ/mol} \quad \text{Equation 5}$$

The third injection portion 330 may inject the chlorine ($Cl_2$) gas. The chlorine gas may accelerate reaction between the cleaning gas and the reactant.

Turning back to discussion of the second injection portion 320, the second injection portion 320 may include a reaction nozzle or reaction gas nozzle 321 that is elongated along the first direction D1. The reaction nozzle 321 may be provided vertically in the process chamber 100. The second injection portion 320 may face the first injection portion 310. In some embodiments, the reaction nozzle 321 and the source nozzle 311 may face each other across the substrate load member 210 of the support unit 200. The source nozzle 311 and the reaction nozzle 321 may be on opposite sides of the substrate load member 210 of the support unit 200. The reaction nozzle 321 may be spaced apart from the source nozzle 311 in a second direction D2 perpendicular to the first direction D1 (e.g., in a horizontal direction). The reaction nozzle 321 and the source nozzle 311 may be positioned to seat in a face-to-face manner on an imaginary line coincident with a diameter of the inner tube 110. The source nozzle 311 and the reaction nozzle 321 may be diametrically opposed across the process chamber 100 and/or the inner tube 110. The source nozzle 311 may inject the source gas toward the support unit 200, and the reaction nozzle 321 may inject the reaction gas toward the support unit 200. The reaction nozzle 321 may include a plurality of second injection apertures or holes arranged along the first direction D1. The second injection holes may be arranged in the same or similar way as the first injection holes 315. The first injection holes 315 may face the second injection holes.

Turning back to discussion of the third injection portion 330, the third injection portion 330 may include a cleaning nozzle or cleaning gas nozzle 331 that is elongated along the first direction D1. The cleaning nozzle 331 may be provided vertically in the process chamber 100. In some embodiments, the cleaning nozzle 331 may be positioned in the inner tube 110. In other embodiments, a plurality of the cleaning nozzles 331 may be provided, with one or more cleaning nozzles 331 between the inner tube 110 and the support unit 200 and one or more cleaning nozzles 331 between the inner tube 110 and the outer tube 120. The third injection portion 330 may lie or be adjacent the first injection portion 310. The cleaning nozzle 331 may lie or be adjacent the source nozzle 311. In some embodiments, the cleaning nozzle 331 may be spaced apart from the source nozzle 311 in a third direction D3 perpendicular to the first and second directions D1 and D2. In some embodiments, the cleaning nozzle 331 may be circumferentially spaced apart from the source nozzle 311. The cleaning nozzle 331 may include a plurality of third injection apertures or holes 335 arranged along the first direction D1.

The fourth injection portion 340 may inject the chemical gas to remove the cleaning gas. The fourth injection portion 340 may include a chemical nozzle or chemical gas nozzle 341 that is elongated along the first direction D1. The chemical nozzle 341 may be provided vertically in the inner tube 110 of the process chamber 100. The chemical nozzle 341 may be spaced apart in the third direction D3 from the cleaning nozzle 331. In some embodiments, the chemical nozzle 341 may be circumferentially spaced apart from the cleaning nozzle 331. The chemical nozzle 341 may include a plurality of fourth injection apertures or holes 345 arranged along the first direction D1.

The chemical gas may include one or more of $H_2O$, hydrogen ($H_2$), and ozone ($O_3$). The chemical gas may react with the cleaning gas. The following equations may express that the chemical gas removes a remaining cleaning gas after the cleaning process.

$$BCl_3 + H_2O \rightarrow B(OH)x \text{ or } BOClx + HCl \quad \text{Equation 6}$$

$$BCl_3 + O_3 \rightarrow BOClx \text{ or } BOx + Cl_2 \quad \text{Equation 7}$$

$$CHCl_3 + O_3 \rightarrow CO_2 + H_2O + Cl_2 \quad \text{Equation 8}$$

$$BCl_3 + H_2 \rightarrow BH_3 + Cl_2 \quad \text{Equation 9}$$

$$CHCl_3 + H_2 \rightarrow CH_4 + Cl_2 \quad \text{Equation 10}$$

In some embodiments, the source nozzle 311, the cleaning nozzle 331, and the chemical nozzle 341 may be sequentially arranged in a counterclockwise direction, but they are not limited thereto.

The heating unit 400 may be installed to surround the process chamber 100. The heating unit 400 may heat up the process chamber 100. The heating unit 400 may cause the process chamber 100 to fall within a temperature of between about 500° C. and about 1000° C.

In some embodiments, the cleaning gas may not spontaneously react with the reactant. An enthalpy may be required to react the cleaning gas with the reactant. Accordingly, the heating unit 400 may provide a thermal energy required to react the cleaning gas with the reactant. For example, an enthalpy of about 41 KJ per mole of the reactant may be required to react $BCl_3$ with $Al_2O_3$. The heating unit 400 may heat up the process chamber 100 to provide the cleaning gas with the enthalpy energy. The heating unit 400 may thus cause the cleaning gas to react with the reactant.

Figure 4:
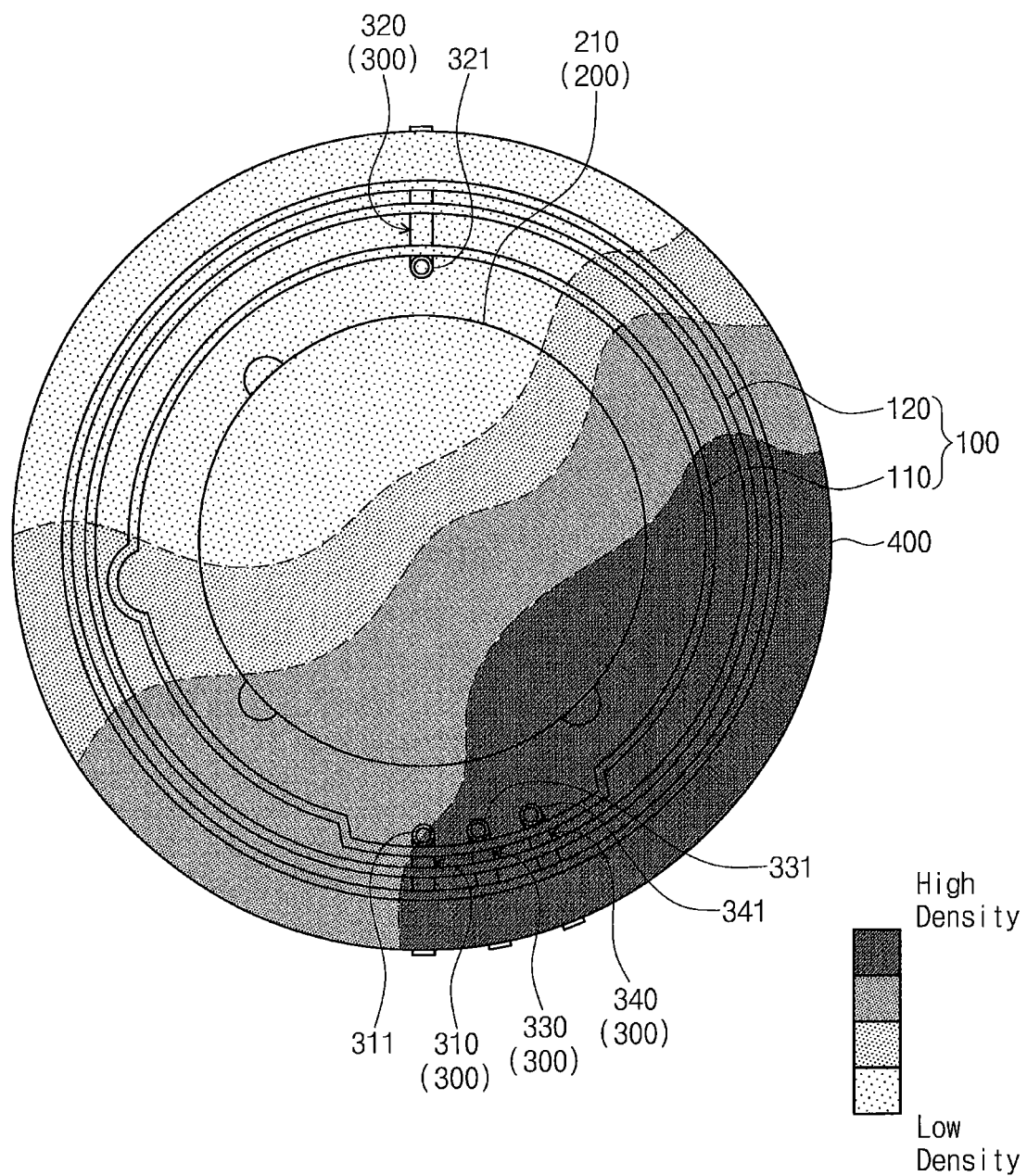
FIG. 4 illustrates a schematic diagram showing distribution of a source gas introduced from a gas injection unit of FIG. 1.
Figure 5:
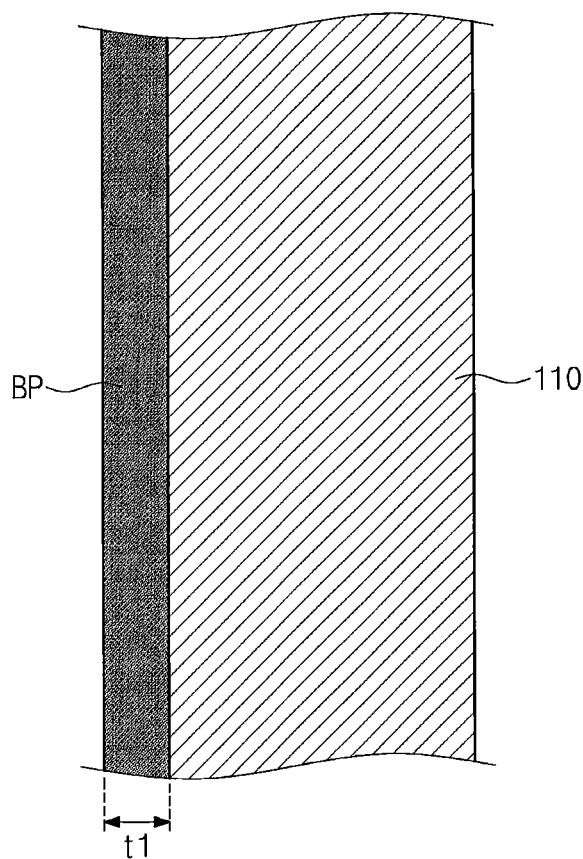
FIG. 5 illustrates an enlarged view showing section A of FIG. 1.
Figure 6:
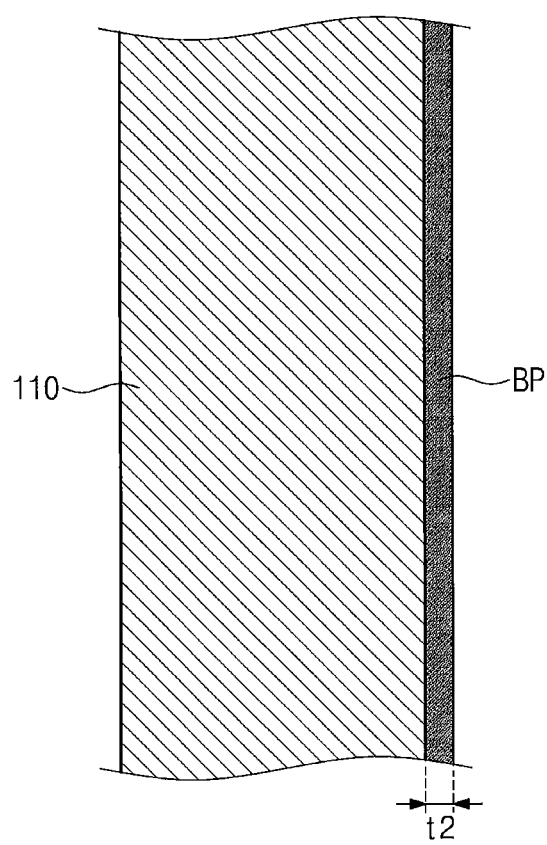
FIG. 6 illustrates an enlarged view showing section B of FIG. 1.

FIG. 4 illustrates a schematic diagram showing distribution of a source gas introduced from a gas injection unit of FIG. 1. FIG. 5 illustrates an enlarged view showing section A of FIG. 1. FIG. 6 illustrates an enlarged view showing section B of FIG. 1.

Referring to FIGS. 2, 4, 5, and 6, the source gas injected from the first injection portion 310 may diffuse into the process chamber 100. Within the process chamber 100, the source gas may have a density that becomes greater (higher) toward, or smaller (lower) away from, the first injection portion 310.

As discussed above, the second injection portion 320 may be positioned to face the first injection portion 310. In such a configuration, since the second injection portion 320 is positioned distant from or spaced apart from the first injection portion 310, the source gas density may become smaller toward the second injection portion 320 that faces the first injection portion 310. As the first and second injection portions 310 and 320 are positioned to face each other in the process chamber 100, the source gas and the reaction gas may insufficiently react with each other in the process chamber 100.

Since the source gas density is greater toward the first injection portion 310, a deposition amount of the reactant BP on the process chamber 100, the support unit 200, and the gas injection unit 300 may become larger toward the first injection portion 310. For example, a thickness t1 of the reactant BP on the inner tube 110 adjacent the first injection portion 310 may be greater than a thickness t2 of the reactant BP on the inner tube 110 adjacent the second injection portion 320.

When the third injection portion 330 is positioned adjacent the first injection portion 310, a density of the cleaning gas in the process chamber 100 may be greater at a region near the first injection portion 310. The cleaning gas may therefore largely or predominantly etch the reactant near the first injection portion 310, which may effectively remove the reactant deposited on the process chamber 100, the support unit 200, and the gas injection unit 300.

Figure 7:
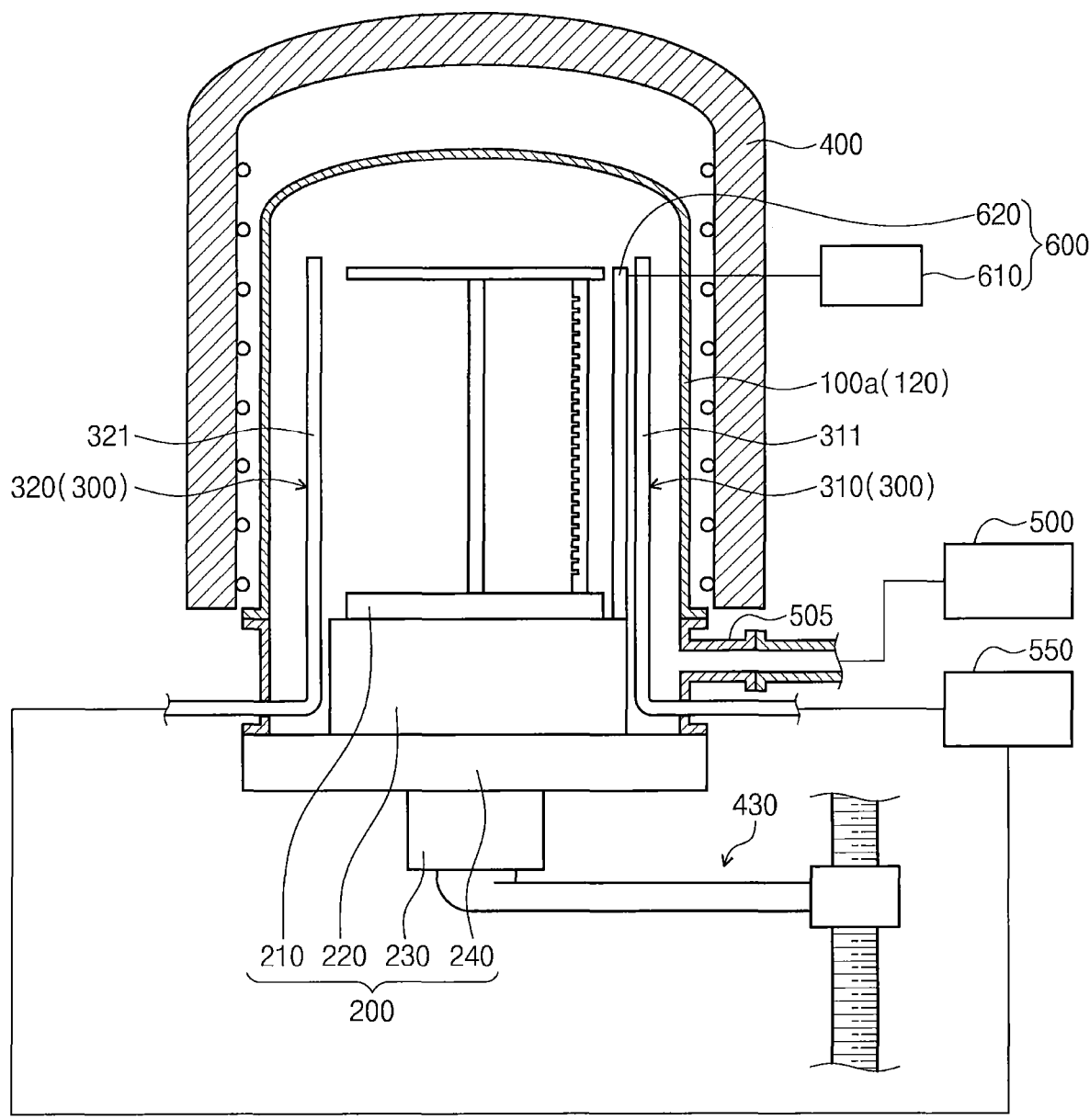
FIG. 7 illustrates a simplified schematic diagram showing a substrate processing apparatus according to example embodiments of the present inventive concepts.
Figure 8:
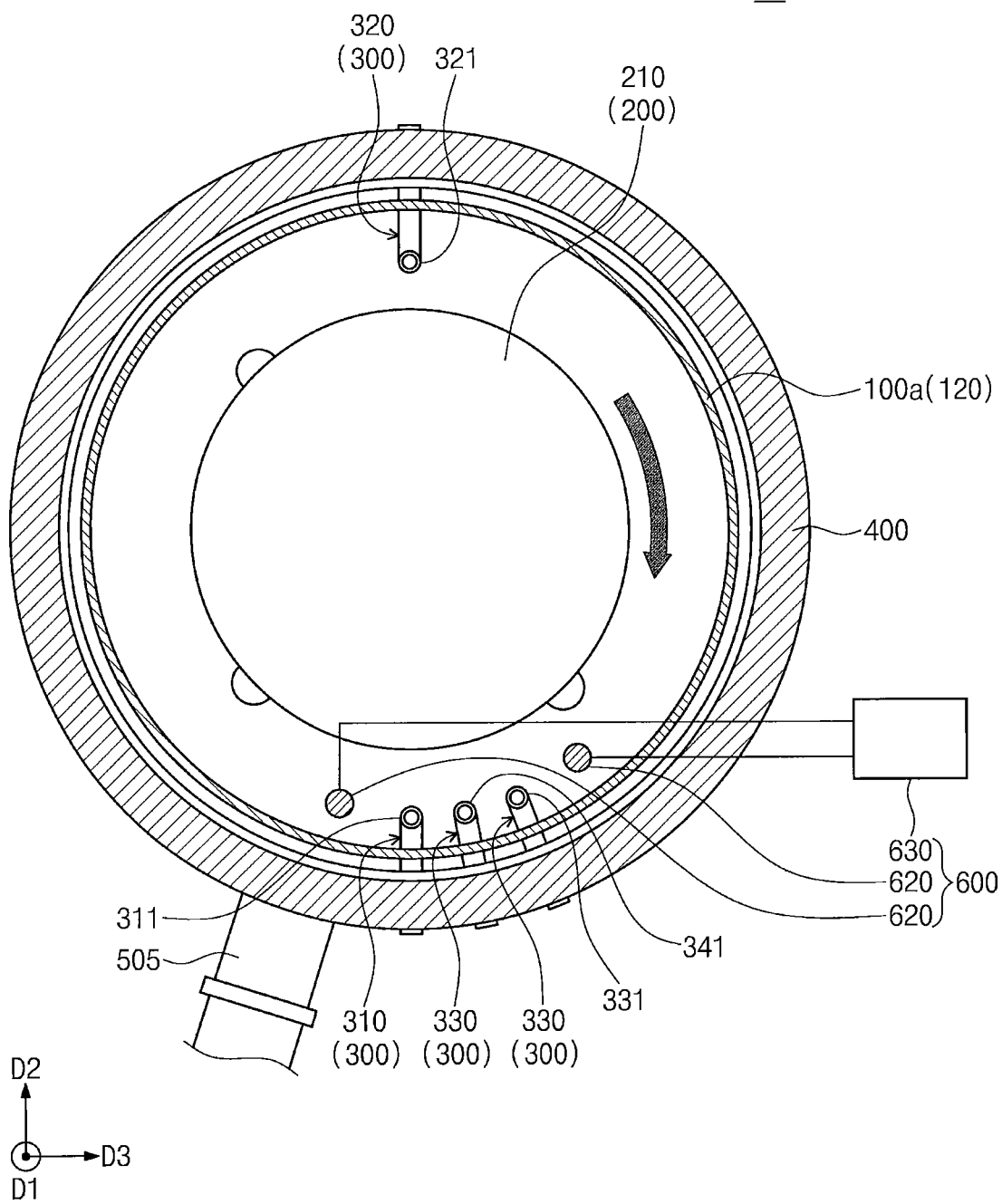
FIG. 8 illustrates a plan view showing the substrate processing apparatus of FIG. 7.

FIG. 7 illustrates a simplified schematic diagram showing a substrate processing apparatus according to example embodiments of the present inventive concepts. FIG. 8 illustrates a plan view showing the substrate processing apparatus of FIG. 7. In the embodiments that follow, components substantially the same as those of the embodiments discussed with reference to FIGS. 1 to 5 may be omitted or abbreviated for brevity of description.

Referring to FIGS. 7 and 8, a substrate processing apparatus 11 according to example embodiments of the present inventive concepts may include a process chamber 100a, a support unit or support system 200, a gas injection unit or gas injection system 300, a gas exhaust unit or gas exhaust system 500, and a gas supply unit or gas supply system 550. The substrate processing apparatus 11 may further include a heating unit or heater 400, a plasma unit or plasma system 600, and an elevation unit or elevator 430.

The process chamber 100a may include an outer tube 120. For example, unlike the process chamber 100 of FIG. 1, the process chamber 100a may not include an inner tube (see 110 of FIG. 1). The support unit 200 may include a substrate load member 210, a support plate 220, a seal cap member 240, and a rotating member or rotatable member 230. The gas injection unit 300 may include first, second, third, and fourth injection portions 310, 320, 330, and 340.

The plasma unit 600 may activate a cleaning gas to provide energy to the cleaning gas. For example, the plasma unit 600 may provide the cleaning gas with energy to dissociate $CCl_4$ included in the cleaning gas into a positive carbon (C) ion and a negative chlorine (Cl) ion. For example, the plasma unit 600 may generate plasma from the cleaning gas. The dissociated positive carbon ion and the negative chlorine ion may easily react with a reactant.

In some embodiments, the plasma unit 600 may include electrodes 620 in the process chamber 100a and an external power or power source 610 that applies power to the electrodes 620. The electrodes 620 may be spaced apart from each other. The electrodes 620 may be positioned on opposite sides of a cleaning nozzle 331. When the electrodes 620 are supplied with power, the cleaning gas may be activated into plasma.

Figure 9:
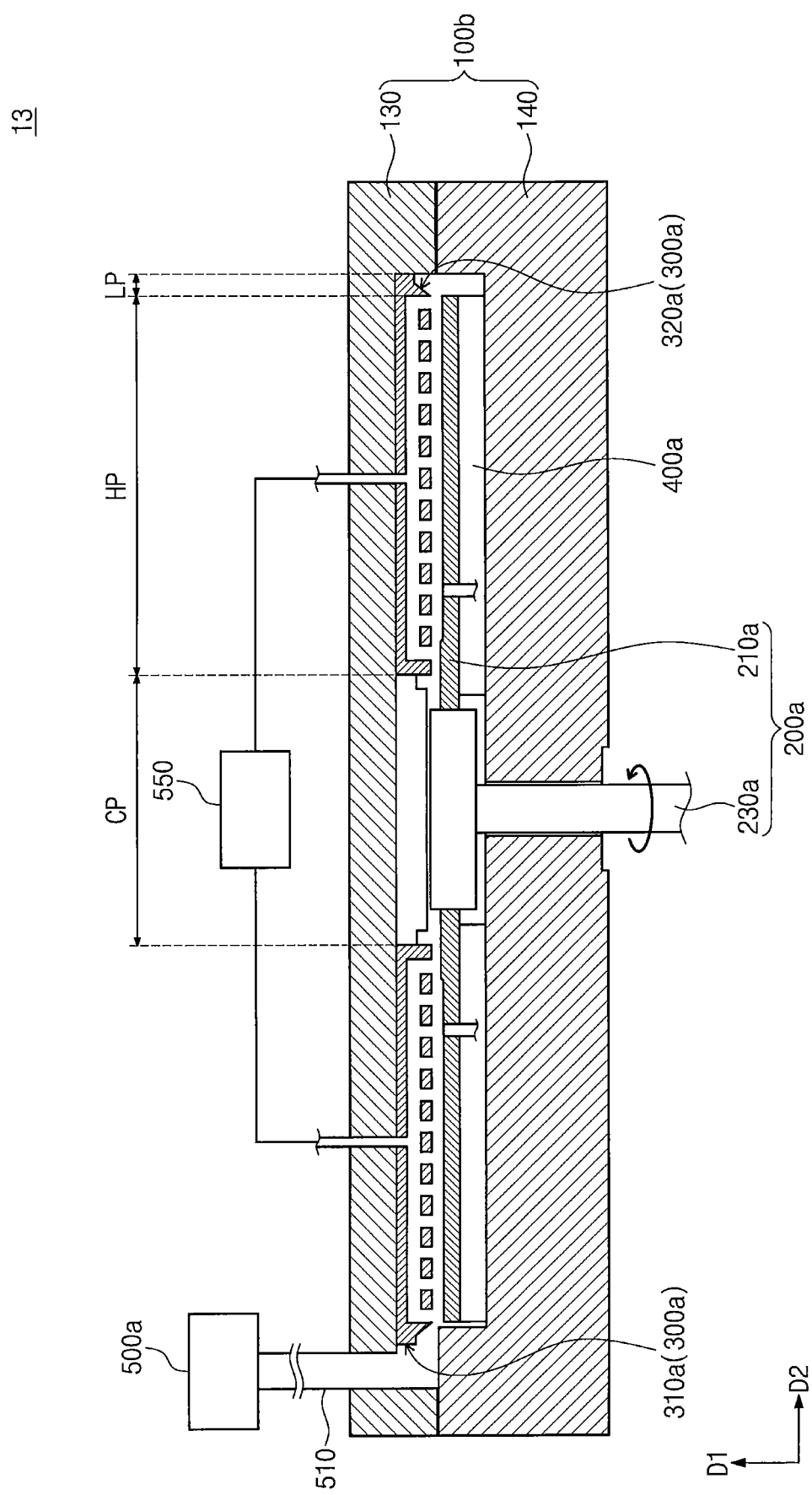
FIG. 9 illustrates a simplified schematic diagram showing a substrate processing apparatus according to example embodiments of the present inventive concepts.
Figure 10:
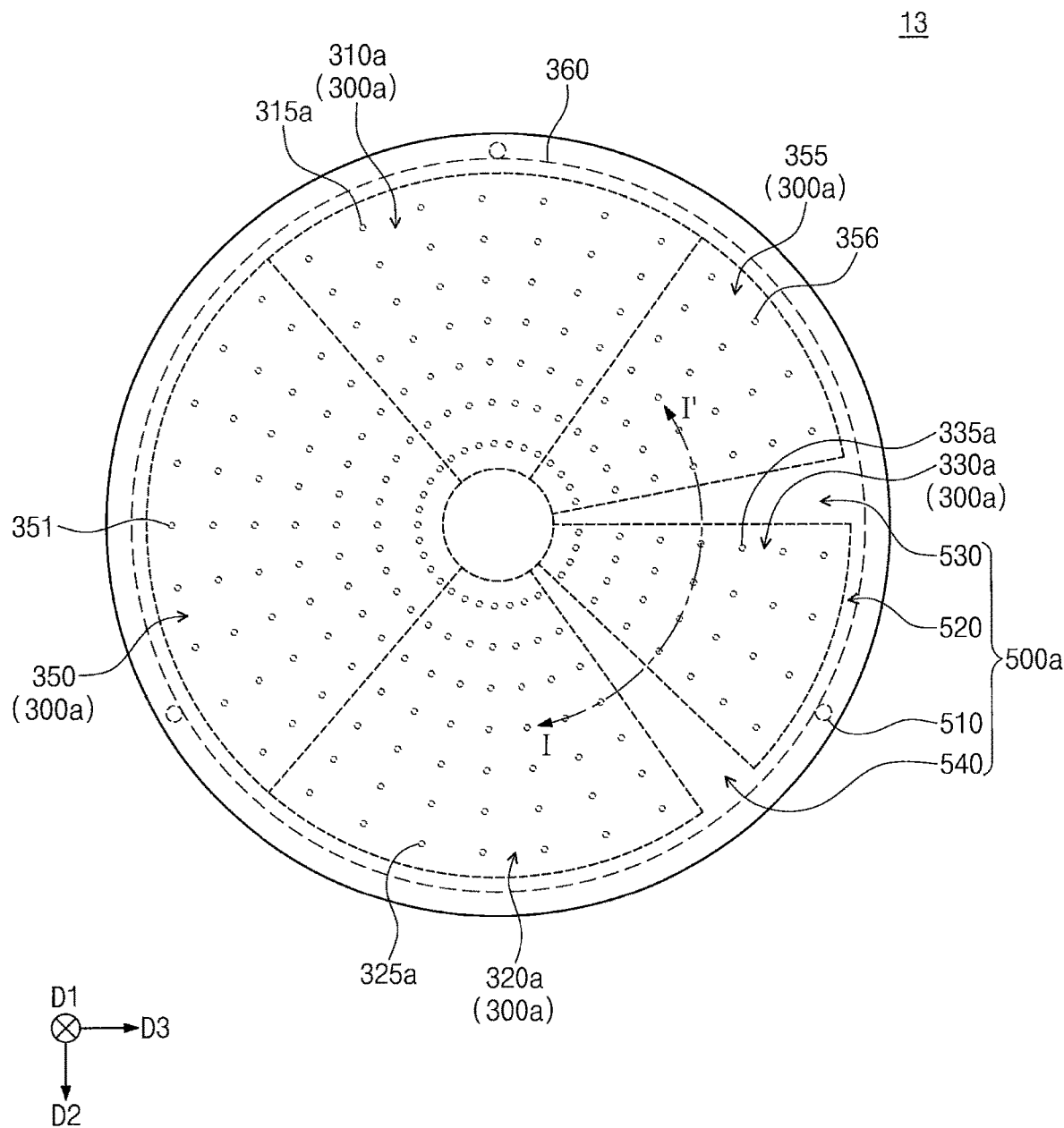
FIG. 10 illustrates a plan view showing the substrate processing apparatus of FIG. 9.
Figure 11:
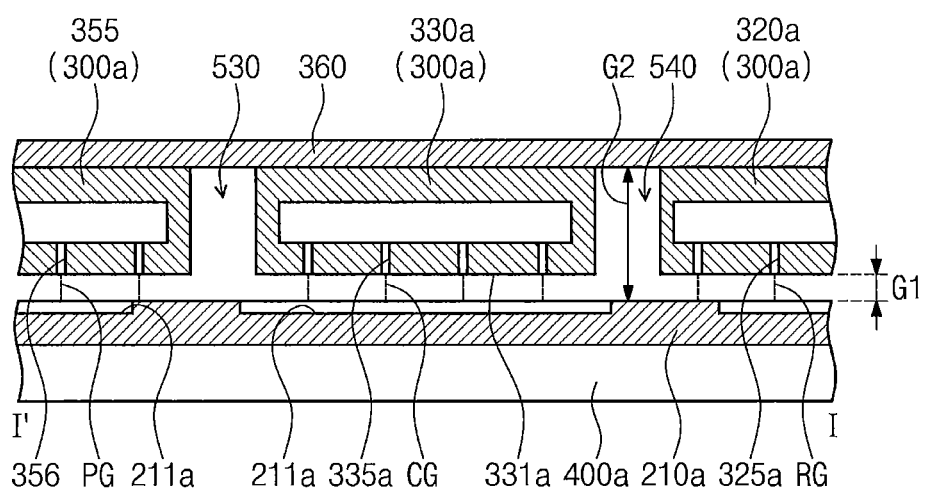
FIG. 11 illustrates a cross-sectional view taken along line I-I' of FIG. 10.

FIG. 9 illustrates a simplified schematic diagram showing a substrate processing apparatus according to example embodiments of the present inventive concepts. FIG. 10 illustrates a plan view showing the substrate processing apparatus of FIG. 9. FIG. 11 illustrates a cross-sectional view taken along line I-I' of FIG. 10. In the embodiments that follow, components substantially the same as those of the embodiments discussed with reference to FIGS. 1 to 5 may be omitted or abbreviated for brevity of description.

Referring to FIGS. 9 to 11, a substrate processing apparatus 13 according to example embodiments of the present inventive concepts may be a space-division ALD apparatus. The substrate processing apparatus 13 may include a process chamber 100b, a support unit or support system 200a, a gas injection unit or gas injection system 300a, a gas exhaust unit 500a, a gas supply unit or gas supply system 550, and a heating unit or heater 400a.

The process chamber 100b may include an upper housing 130 and a lower housing 140. The upper and lower housings 130 and 140 may have but are not limited to a circular vessel shape. The upper and lower housings 130 and 140 may be detachably combined with or coupled to each other. For example, the lower housing 140 may move vertically to separate from or combine with (couple to) the upper housing 130. The upper housing 130 may be positioned in a first direction D1 from the lower housing 140.

The support unit 200a may be positioned below or beneath the gas injection unit 300a in the process chamber 100b. The support unit 200a may include a substrate support member 210a and a rotating member or rotatable member 230a. In some embodiments, the substrate support member 210a may be a susceptor. The substrate support member 210a may be provided in the shape of a circular plate. The substrate support member 210a may include a plurality of insert grooves 211a arranged along a circumferential direction of the substrate support member 210a. The insert grooves 211a may receive substrates inserted therein. The insert grooves 211a may each have a concave shape that is recessed from a top surface of the substrate support member 210a toward a bottom surface of the substrate support member 210a. The top surface of the substrate support member 210a may face the gas injection unit 300a. The rotating member 230a may be associated with the substrate support member 210a. The rotating member 230a may rotate the substrate support member 210a.

In some embodiments, the gas injection unit 300a may be positioned over the support unit 200a in the process chamber 100b. The gas injection unit 300a may be a shower head. The gas injection unit 300a may inject a diversity or plurality of process gases toward the support unit 200a. The gas injection unit 300a may include a central part CP, high-pressure parts HP, and a low-pressure part LP. The central part CP may occupy a center, or an approximate center, of the gas injection unit 300a. The high-pressure parts HP may be connected to or extend from the central part CP. The high-pressure parts HP may be regions to or from which the process gases are injected. The high-pressure parts HP may be at about 10 mTorr to about 100 mTorr. The high-pressure parts HP may be arranged in a fan shape about the central part CP. The low-pressure part LP may surround the high-pressure parts HP. The low-pressure part LP may be a region from which the process gases are exhausted. The low-pressure part LP and the central part CP may be at about 1 mTorr to about 10 mTorr. The gas injection unit 300a may include a circular base 360 and a plurality of injection portions 310a, 320a, 330a, 350, and 355.

The plurality of injection portions 310a, 320a, 330a, 350, and 355 may be placed on the base 360. The plurality of injection portions 310a, 320a, 330a, 350, and 355 may be arranged along a circumferential direction of the base 360, when viewed from a top plane. In some embodiments, the phrase "top plane" may refer to a plane parallel to second and third directions D2 and D3. The plurality of injection portions 310a, 320a, 330a, 350, and 355 may be arranged in a circular pattern on the base 360. The plurality of injection portions 310a, 320a, 330a, 350, and 355 may include first, second, and third injection portions 310a, 320a, and 330a and first and second purge gas injection portions 350 and 355.

The first injection portion 310a and the second injection portion 320a may respectively inject a source gas and a reaction gas RG, which are raw gases to deposit a thin layer on a substrate. The first and second purge gas injection portions 350 and 355 may inject a purge gas PG. The purge gas PG may purge non-reacted raw gases. For example, the purge gas PG may be a non-reactive gas.

The first to third injection portions 310a, 320a, and 330a may be sequentially arranged along the circumferential direction of the base 360. The first to third injection portions 310a, 320a, and 330a may include a plurality of radially arranged first to third injection holes 315a, 325a, and 335a, respectively. The second injection portion 320a may face the first injection portion 310a across the central part CP of the base 360. The first injection portion 310a and the second injection portion 320a may be on opposite sides of the central part CP of the base 360. The second injection portion 320a may be spaced apart in the second direction D2 from the first injection portion 310a.

The first purge gas injection portion 350 may be positioned between the first injection portion 310a and the second injection portion 320a. In some embodiments, the second purge gas injection portion 355 may be positioned between the first injection portion 310a and the third injection portion 330a. In other embodiments, the second purge gas injection portion 355 may be positioned between the second injection portion 320a and the third injection portion 330a. In such a configuration, the source gas and the reaction gas RG may not mix with each other in the process chamber 100b. In addition, a cleaning gas CG and the source gas may not mix with each other in the process chamber 100b. The first and second purge gas injection portions 350 and 355 may include a plurality of radially arranged first and second purge gas injection holes 351 and 356, respectively.

The gas exhaust unit 500a may exhaust the process gases from the process chamber 100b. The gas exhaust unit 500a may include a first exhaust portion 510 and a second exhaust portion 520, 530, and 540. The first exhaust portion 510 may be positioned outside the gas injection unit 300a. The second exhaust portion 520, 530, and 540 may be positioned inside the gas injection unit 300a. In some embodiments, the first exhaust portion 510 may be provided as an exhaust port that penetrates the upper housing 130, but the position and configuration of the first exhaust portion 510 is not limited thereto. The first injection portion 510 and the second exhaust portions 520, 530, and 540 may be or correspond to the low-pressure part LP discussed above.

The second exhaust portion 520, 530, and 540 may be provided to have a variety of shapes in the gas injection unit 300a. In some embodiments, the second exhaust portion 520, 530, and 540 may include a main exhaust portion 520, a first sub-exhaust portion 530, and a second sub-exhaust portion 540.

The main exhaust portion 520 may be provided in a ring shape extending along a circumference of the base 360. The main exhaust portion 520 may be connected or fluidly connected to the first exhaust portion 510. The main exhaust portion 520 may be positioned between the first exhaust portion 510 and the first and second sub-exhaust portions 530 and 540.

The first and second sub-exhaust portions 530 and 540 may be connected or fluidly connected to the main exhaust portion 520. The first sub-exhaust portion 530 may be provided in a linear or fan shape between the first injection portion 310a and the third injection portion 330a. In some embodiments, the first sub-exhaust portion 530 may be provided in a linear or fan shape between the third injection portion 330a and the second purge gas injection portion 355. The second sub-exhaust portion 540 may be provided in a linear or fan shape between the second injection portion 320a and the third injection portion 330a. For example, the first and second sub-exhaust portions 530 and 540 may be spaced apart from each other across or by the third injection portion 330a.

The first and second sub-exhaust portions 530 and 540 (referred to hereinafter as sub-exhaust portions) may each have a concave shape that is recessed toward the base 360 from or relative to a bottom surface 331a of the third injection portion 330a. A gap G2 between the substrate support member 210a and bottom surfaces of the sub-exhaust portions 530 and 540 may be greater than a gap G1 between the substrate support member 210a and the bottom surface 331a of the third injection portion 330a. As such, the sub-exhaust portions 530 and 540 may be or correspond to the low-pressure part LP whose pressure is smaller than that of the third injection portion 330a. A difference in pressure between the third injection portion 330a and the sub-exhaust portions 530 and 540 may cause the cleaning gas CG to flow toward the sub-exhaust portions 530 and 540. The sub-exhaust portions 530 and 540 may favorably affect the flow of the cleaning gas CG and may prevent the cleaning gas CG from being mixed with other gases.

The heating unit 400a may be disposed below or beneath the support unit 200a. The heating unit 400a may heat up substrates placed on the support unit 200a. The heating unit 400a may adjust a temperature of the substrate to easily control deposition of a thin layer on the substrate. A portion of the heating unit 400a may be positioned to vertically overlap or align with the third injection portion 330a. The heating unit 400a may provide a thermal energy to the cleaning gas CG injected from the third injection portion 330a. The cleaning gas CG may thus react with a reactant.

The following explains an operation of the substrate processing apparatuses configured as described above according to example embodiments of the present inventive concepts.

Figure 12:
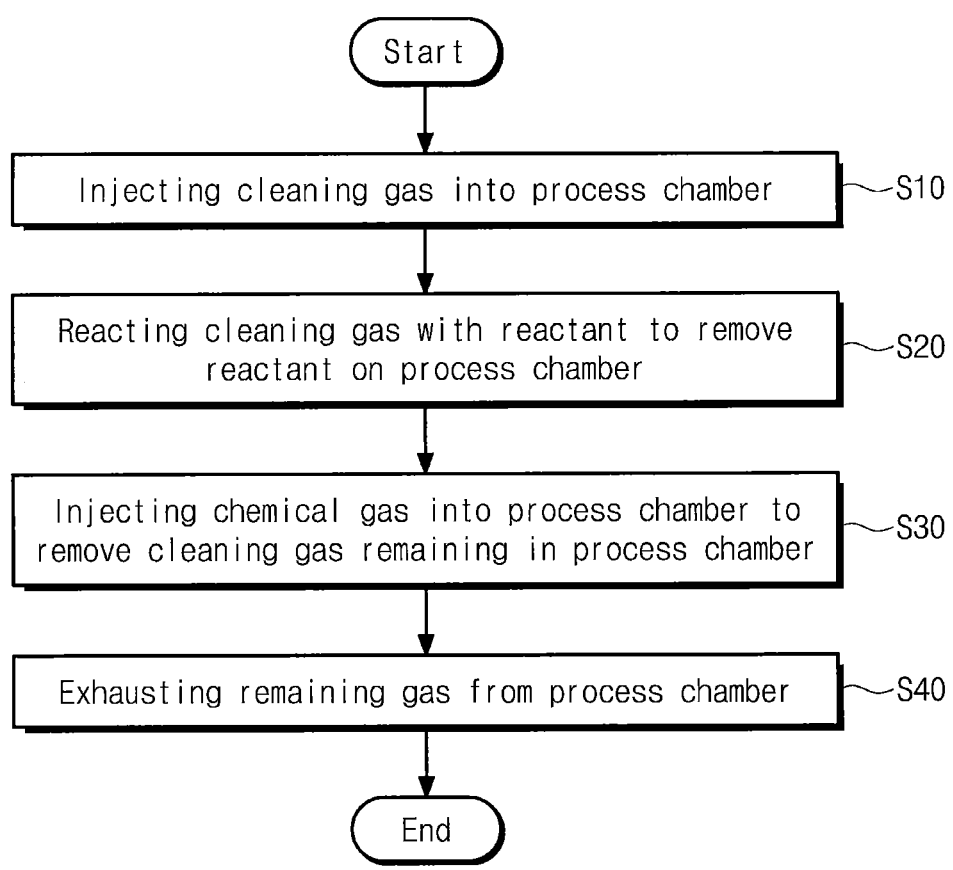
FIG. 12 illustrates a flow chart showing a method of cleaning the substrate processing apparatus of FIG. 1.

FIG. 12 illustrates a flow chart showing a method of cleaning the substrate processing apparatus of FIG. 1.

Referring to FIGS. 1 and 12, the gas injection unit 300 may provide the process chamber 100 with the source gas and the reaction gas to deposit a thin layer on a substrate placed on the support unit 200. In some embodiments, the source gas may include an aluminum (Al) precursor, and the reaction gas may include one or more of $H_2O$, ozone ($O_3$), and oxygen ($O_2$). The source gas and the reaction gas may react to deposit an $Al_2O_3$ layer on the substrate. The $Al_2O_3$ layer may also be deposited on the process chamber 100, the support unit 200, and nozzles of the gas injection unit 300.

The cleaning gas may be injected into the process chamber 100 to remove the $Al_2O_3$ layer deposited on the process chamber 100, the support unit 200, and the nozzles of the gas injection unit 300 (S10). As discussed above, the cleaning gas may include one or more of boron trichloride ($BCl_3$), CHxCly (where, x=0 to 4 and y=4−x), and SiHxCly (where, x=0 to 4 and y=x−4). Hereinafter, an example is discussed in which a $CHCl_3$ gas is adopted as the cleaning gas.

The $Al_2O_3$ layer may be removed by reacting the cleaning gas with the $Al_2O_3$ layer deposited on the process chamber 100, the support unit 200, and the nozzles of the gas injection unit 300 (S20). For example, the injected cleaning gas may not spontaneously react with the $Al_2O_3$ layer. Accordingly, the cleaning gas may be supplied with energy to react the cleaning gas with the $Al_2O_3$ layer.

In some embodiments, the heating unit 400 may provide energy to the cleaning gas. For example, the heating unit 400 may heat up the process chamber 100 and thus an inner temperature of the process chamber 100 may be maintained within a range of between about 500° C. and about 1000° C. The cleaning gas may thus be provided with a thermal energy. In this case, the energy may be greater than an enthalpy required for dissociating the cleaning gas into positive ions and negative ions. As the heating unit 400 provides the cleaning gas with the energy, the cleaning gas may react with the $Al_2O_3$ layer. It therefore may be possible to remove the $Al_2O_3$ layer deposited on the process chamber 100, the support unit 200, and the nozzles of the gas injection unit 300. The reaction between the cleaning gas and the $Al_2O_3$ layer may produce a reaction byproduct including $AlCl_3$, CO, and $H_2O$. In other embodiments, as illustrated in FIG. 7, the plasma unit 600 may provide energy to the cleaning gas.

When the cleaning gas remains in the process chamber 100, the remaining cleaning gas may etch a reactant deposited on the substrate. Hence, the remaining cleaning gas may lead to defective deposition on the substrate. To hinder or prevent the defective deposition on the substrate, the process chamber 100 may be provided with the chemical gas including one or more of $H_2O$, ozone ($O_3$), and oxygen ($O_2$). The chemical gas may react with the cleaning gas to thereby remove the cleaning gas remaining in the process chamber 100 (S30). For example, the $CHCl_3$ gas may react with the chemical gas of $O_3$ to produce a reaction byproduct such as $CO_2$, $H_2O$, and/or $Cl_2$.

Remaining gases may be exhausted from the process chamber 100 (S40). The exhausted remaining gases may include the reaction byproduct, the cleaning gas, the chemical gas, and the like. As the remaining gases are exhausted from the process chamber 100, the substrate processing apparatus 10 on which $Al_2O_3$ is deposited may be cleaned in situ.

According to example embodiments of the present inventive concepts, the reactant may be minimally deposited on components of the substrate processing apparatus, and as a result, it may be possible to effectively remove the reactant deposited on the components.

Effects of the present inventive concepts are not limited to those mentioned above, and other effects which have not been mentioned above will be clearly understood to those skilled in the art from the present description.

Although the present inventive concepts have been described in connection with the embodiments of the present inventive concepts illustrated in the accompanying drawings, it will be understood by one of ordinary skill in the art that variations in form and detail may be made therein without departing from the spirit and essential features of the inventive concepts. The above disclosed embodiments should thus be considered illustrative and not restrictive.

What is claimed is:

1. A substrate processing apparatus comprising: a process chamber; a support unit in the process chamber and configured to support a substrate; and a gas injection unit in the process chamber, wherein the gas injection unit comprises: a first injection portion comprising a source nozzle and configured to inject a source gas directly toward the support unit; a second injection portion comprising a reaction nozzle facing the source nozzle and configured to inject a reaction gas that reacts with the source gas directly toward the support unit, wherein the first injection portion and the second injection portion are on opposite sides of the process chamber; a third injection portion configured to inject a cleaning gas that removes a reactant produced from the source gas and the reaction gas, the cleaning gas including one or more of boron trichloride ($BCl_3$) and $C_xCl_y$ (where, x=0 to 4 and y=4−x); and a fourth injection portion configured to inject a chemical gas that removes the cleaning gas, the chemical gas including hydrogen ($H_2$).

2. The apparatus of claim 1, wherein the third injection portion is positioned adjacent the first injection portion.

3. The apparatus of claim 1, wherein the source gas comprises an aluminum (Al) precursor, the reaction gas comprises $H_2O$ or ozone ($O_3$), and the cleaning gas further comprises $Si_xCl_y$ (where, x=0 to 4 and y=4−x).

4. The apparatus of claim 1, wherein the chemical gas further comprises $H_2O$ or ozone ($O_3$).

5. The apparatus of claim 1, wherein the support unit comprises: a substrate load member configured to load a plurality of substrates into the process chamber along a first direction; a support plate configured to support the substrate load member; and a rotatable member configured to rotate the support plate.

6. The apparatus of claim 5, wherein the third injection portion comprises a cleaning nozzle that extends along the first direction and is configured to inject the cleaning gas.

7. The apparatus of claim 6, wherein the cleaning nozzle comprises a plurality of injection holes defined therein and arranged along the first direction.

8. The apparatus of claim 5, wherein the source nozzle extends along the first direction and is configured to inject the source gas, and the reaction nozzle extends along the first direction and is configured to inject the reaction gas, wherein the source nozzle and the reaction nozzle are on opposite sides of the substrate load member and positioned to face each other across the substrate load member.

9. The apparatus of claim 1, further comprising a heating unit that surrounds the process chamber and is configured to heat the process chamber.

10. The apparatus of claim 1, further comprising a gas exhaust unit configured to exhaust gases from the process chamber.

11. The apparatus of claim 1, wherein the process chamber comprises yttrium oxide ($Y_2O_3$).

12. A substrate processing apparatus comprising: a process chamber; a source gas supply containing a source gas; a reaction gas supply containing a reaction gas; a cleaning gas supply containing a cleaning gas; a chemical gas supply containing a chemical gas; a support unit in the process chamber and configured to support a substrate; and a gas injection unit in the process chamber, wherein the gas injection unit comprises: a source gas injection portion in fluid communication with the source gas supply and configured to inject the source gas, the source gas injection portion comprising a source nozzle; a reaction gas injection portion in fluid communication with the reaction gas supply and configured to inject the reaction gas that reacts with the source gas, the reaction gas injection portion comprising a reaction nozzle that faces the source nozzle, wherein the source gas injection portion and the reaction gas injection portion are on opposite sides of the process chamber; a cleaning gas injection portion in fluid communication with the cleaning gas supply and configured to inject the cleaning gas that removes a reactant produced from the source gas and the reaction gas, the cleaning gas including one or more of boron trichloride ($BCl_3$) and $C_xCl_y$, (where, x=0 to 4 and y=4−x); and a chemical injection portion configured to inject the chemical gas that removes the cleaning gas, the chemical gas including hydrogen ($H_2$).

13. A substrate processing apparatus comprising: a process chamber; a support unit in the process chamber and configured to support a substrate; and a gas injection unit comprising a cleaning gas injection portion configured to provide the process chamber with a cleaning gas that removes a reactant on the process chamber, wherein the reactant comprises aluminum oxide ($Al_2O_3$), wherein the gas injection unit comprises: a source gas injection portion comprising a source nozzle and configured to inject a source gas into the process chamber; a reaction gas injection portion comprising a reaction nozzle facing the source nozzle and configured to inject a reaction gas that reacts with the source gas to produce the reactant, wherein the source gas injection portion and the reaction gas injection portion are on opposite sides of the process chamber; a cleaning gas injection portion adjacent the source gas injection portion and configured to inject the cleaning gas that removes the reactant produced from the source gas and the reaction gas, the cleaning gas including one or more of boron trichloride ($BCl_3$) and $C_xCl_y$, (where, x=0 to 4 and y=4−x); and a chemical injection portion adjacent the cleaning gas injection portion and configured to inject a chemical gas that removes the cleaning gas, the chemical gas including hydrogen ($H_2$).

14. The apparatus of claim 13, further comprising a gas exhaust unit configured to exhaust gases from the process chamber.

15. The apparatus of claim 1, further comprising a plasma unit comprising first and second electrodes positioned on opposite sides of the third injection portion.

16. The apparatus of claim 13, wherein the support unit comprises: a substrate load member configured to load a plurality of substrates into the process chamber along a first direction; a support plate configured to support the substrate load member; and a rotatable member configured to rotate the support plate.

17. The apparatus of claim 16, wherein the cleaning gas injection portion comprises a cleaning nozzle that extends along the first direction and is configured to inject the cleaning gas.

18. The apparatus of claim 17, wherein the cleaning nozzle comprises a plurality of injection holes defined therein and arranged along the first direction.

19. The apparatus of claim 16, wherein the source nozzle comprises a plurality of injection holes defined therein and arranged along the first direction, and the reaction nozzle comprises a plurality of injection holes defined therein and arranged along the first direction, wherein the injection holes of the source nozzle and the injection holes of the reaction nozzle are on opposite sides of the substrate load member and positioned to face each other across the substrate load member.

20. The apparatus of claim 13, further comprising a heating unit that surrounds the process chamber and is configured to heat the process chamber.

* * * * *